United States Patent
Fair et al.

(10) Patent No.: US 6,720,260 B1
(45) Date of Patent: Apr. 13, 2004

(54) SEQUENTIAL ELECTRON INDUCED CHEMICAL VAPOR DEPOSITION

(75) Inventors: James A. Fair, Mountain View, CA (US); Nerissa Taylor, Milpitas, CA (US)

(73) Assignee: Novellus Systems, Inc., San Jose, CA (US)

( * ) Notice: Subject to any disclaimer, the term of this patent is extended or adjusted under 35 U.S.C. 154(b) by 37 days.

(21) Appl. No.: 10/600,622

(22) Filed: Jun. 20, 2003

Related U.S. Application Data

(62) Division of application No. 09/849,075, filed on May 3, 2001, now Pat. No. 6,627,268.

(51) Int. Cl.[7] ............................................. C23C 16/452
(52) U.S. Cl. .................. 438/680; 438/798; 427/533; 427/585; 117/93; 117/103; 117/108
(58) Field of Search ................................ 438/680, 798; 427/533, 585; 117/93, 103, 108

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,985,657 A | 1/1991 | Campbell | |
| 5,711,811 A | 1/1998 | Suntola et al. | |
| 5,916,365 A | 6/1999 | Sherman | |
| 6,015,590 A | 1/2000 | Suntola et al. | |
| 6,267,074 B1 | * 7/2001 | Okumura | 118/723 |
| 6,368,678 B1 | * 4/2002 | Bluck et al. | 427/569 |
| 6,416,822 B1 | 7/2002 | Chiang et al. | |
| 6,518,195 B1 | * 2/2003 | Collins et al. | 438/723 |
| 6,627,268 B1 | * 9/2003 | Fair et al. | 427/533 |
| 2001/0048981 A1 | * 12/2001 | Suzuki | 427/569 |
| 2003/0161969 A1 | * 8/2003 | Hilliard | 427/571 |

FOREIGN PATENT DOCUMENTS

| | | |
|---|---|---|
| EP | 0015390 | 9/1985 |
| WO | WO96/17969 | 6/1996 |
| WO | WO96/01595 | 1/1999 |

* cited by examiner

*Primary Examiner*—Alexander Ghyka
(74) *Attorney, Agent, or Firm*—Beyer Weaver & Thomas, LLP

(57) ABSTRACT

Ion-induced, UV-induced, and electron-induced sequential chemical vapor deposition (CVD) processes are disclosed where an ion flux, a flux of ultra-violet radiation, or an electron flux, respectively, is used to induce the chemical reaction in the process. The process for depositing a thin film on a substrate includes introducing a flow of a first reactant gas in vapor phase into a process chamber where the gas forms an adsorbed saturated layer on the substrate and exposing the substrate to a flux of ions, a flux of ultra-violet radiation, or a flux of electrons for inducing a chemical reaction of the adsorbed layer of the first reactant gas to form the thin film. A second reactant gas can be used to form a compound thin film. The ion-induced, UV-induced, and electron-induced sequential CVD process of the present invention can be repeated to form a thin film of the desired thickness.

16 Claims, No Drawings

SEQUENTIAL ELECTRON INDUCED CHEMICAL VAPOR DEPOSITION

This a divisional application of prior application Ser. No. 09/849,079 filed on May 3, 2001 now U.S. Pat. No. 6,627,268.

BACKGROUND OF THE INVENTION

1. Field of the Invention

The invention relates to the chemical vapor deposition processes used in the fabrication of semiconductor devices, and more particularly to methods for sequential chemical vapor deposition of thin films.

2. Description of the Related Art

Chemical vapor deposition (CVD) is one of the principal methods used in semiconductor fabrication to form a variety of thin films, including dielectric and conductive layers. In chemical vapor deposition, a material layer is formed by the reaction of gas phase reactants at or near a substrate surface. Various methods of energy input can be used to promote the chemical reaction, including thermal energy, photons, and plasma. In a plasma-assisted CVD process, the reaction is promoted by activating the gas phase reactants to form radical species, electrons and ions, which form a plasma. Background gases which participate in forming a plasma, but may or may not participate in the deposition reaction may also be included in plasma-assisted CVD processes. The properties of the deposited material, as well as the rate at which material is deposited may depend on precursor gases to the gas phase reactants, on the background gases, and on the plasma conditions.

Advances in semiconductor devices increase the demands for chemical vapor deposition of highly conformal and uniform thin films. In conventional CVD processes, it is often difficult to obtain a thin film that is conformal across the entire surface of a wafer, particularly when the wafer has a large radius. Furthermore, in conventional CVD processes, reaction byproducts often get trapped in the film being grown, affecting the purity and the electrical properties of the film.

U.S. Pat. No. 4,058,430 of Suntola et al. describes an atomic layer epitaxy (ALE) process for growing compound thin films. In the ALE process of the '430 patent, a substrate is exposed to the vapor of a first element in a reaction chamber and the substrate is heated to a temperature sufficiently high to induce a chemical reaction between the first element and the substrate for forming a single atomic layer of the first element on the substrate surface. The heated substrate can be subsequently exposed to the vapor of a second element to form a single atomic layer of the second element on top of the atomic layer of the first element. The process is repeated until the compound film reaches a desired thickness. U.S. Pat. No. 4,398,973 also of Suntola et al. describes an alternate method of performing the ALE process to the '430 patent which uses gaseous compounds to supply the reactive elements. These techniques for ALE processes relate more closely to CVD processes.

In both the '430 and '973 patents, the ALE process is driven by thermal energy through heating the substrate. Specifically, the temperature of the substrate has to be high enough to prevent condensation of the elements on the surface of the substrate and to induce chemical reaction between the reactive elements and the substrate surface. A disadvantage of the ALE process of the '430 and '973 patents is that when forming compound thin films, the different reactive elements must have overlapping temperature windows for forming a saturated layer in order to perform the ALE process. Thus, the ALE process of the '430 and '973 patents has limited applications.

U.S. Pat. No. 5,916,365 describes a sequential chemical vapor deposition process where a first reactant forms a saturated layer on the surface of a substrate and a second reactant is passed through a radical generator which activates the second reactant into a gaseous radical. The gaseous radical of the second reactant is used to induce a chemical reaction of the saturated layer. An disadvantage of the process disclosed in the '365 patent is that the reactive species in the CVD process are limited to free radical species that are generated by the radical generator. Radical generators that can be used in the '365 process generally use plasma discharges to break up most of the bonds in the precursor gas. Thus, the radical generation process is non-selective and all types of radicals, whether beneficial or harmful to the deposition process of interest, are generated. Furthermore, radical generators also suffer from contamination problems as some gases tend to cause a film to be deposited on the walls of the generators.

It is desirable to provide a sequential chemical vapor deposition process with improved process characteristics and also capable of forming a variety of compound thin films with improved film properties.

SUMMARY OF THE INVENTION

According to the present invention, ion-induced, UV-induced, and electron-induced sequential chemical vapor deposition (CVD) processes are disclosed where an ion flux, a flux of ultra-violet radiation, or an electron flux, respectively, is used to induce a chemical reaction for forming a thin film. In one embodiment, a process for depositing a thin film on a substrate includes the steps of: (a) placing the substrate into a process chamber; (b) evacuating the process chamber; (c) introducing a flow of a first reactant gas in vapor phase into the process chamber where the first reactant gas forms an adsorbed saturated layer on the substrate; (d) evacuating the process chamber; (e) exposing the substrate to a flux of ions for inducing a chemical reaction of the adsorbed saturated layer of the first reactant gas to form the thin film; and (f) evacuating the process chamber. In other embodiments, instead of using a flux of ions, a flux of UV light or a flux of electrons is used to induce the chemical reaction.

When a compound thin film is desired, the process of the present invention can include: (g) before exposing the substrate to a flux of ions, introducing a flow of a second reactant gas in vapor phase into the process chamber. The flux of ions induces a chemical reaction of the adsorbed saturated layer of the first reactant gas and the second reactant gas for forming a compound thin film. Again, in other embodiments, instead of using a flux of ions, a flux of UV light or a flux of electrons is used to induce the chemical reaction. Alternatively, the process for forming a compound thin film can include: (g) introducing a flow of a second reactant gas in vapor phase into the process chamber; (h) exposing the substrate to a flux of ions for inducing a chemical reaction of the adsorbed saturated layer of the first reactant gas and the second reactant gas to form a compound thin film; and (i) evacuating the process chamber.

The present invention is better understood upon consideration of the detailed description below and the accompanying drawings.

DETAILED DESCRIPTION OF THE PREFERRED EMBODIMENTS

In accordance with the present invention, a sequential chemical vapor deposition (CVD) process uses either an ion flux, a flux of ultra-violet radiation, or an electron flux as energy input for driving the chemical reaction to form a thin film. The ion-induced, UV-induced, or electron-induced sequential CVD process of the present invention deposits a saturated layer of an element or a compound at a time. The process can be repeated to form a thin film of any desired thickness. A thin film formed using the sequential CVD process of the present invention is uniform and highly conformal. Furthermore, the sequential CVD process of the present invention can be used to form elemental or compound thin films of a wide range of reactive elements since the process can be carried out in a broad temperature window. These and other advantages of the ion-induced, UV-induced, or electron-induced sequential CVD process of the present invention will become more apparent in the description below.

The ion-induced, UV-induced, or electron-induced sequential CVD process of the present invention is carried out in a process chamber, such as a CVD reactor. Suitable process chambers include any conventional low-pressure CVD (LPCVD) reactors or any conventional plasma CVD reactors. As is well known in the art, there are two main types of plasma CVD reactors, hence two main plasma CVD processes. When a capacitively coupled parallel plate reactor is used, the deposition process is conventionally termed plasma-enhanced CVD (PECVD). The plasma may be formed in the PECVD reactor by a radio frequency (rf) discharge at a single frequency. An example of a PECVD reactor is the Sequel™ reactor of Novellus Systems (San Jose, Calif.). Alternatively, a high density plasma reactor (HDP) in which the plasma is formed by electron cyclotron resonance (ECR) or as an inductively coupled plasma (ICP) may be used. An optional rf bias of a different frequency may be applied in HDP reactors. An example of an HDP reactor is the Speed™ reactor of Novellus Systems.

While in the present description, the process chamber is a CVD reactor, one of ordinary skill in the art would appreciate that any type of process chamber can be used to practice the processes of the present invention. For example, the present invention can be carried out in a physical vapor deposition (PVD) chamber or other commonly available semiconductor processing chamber, with appropriate modifications. In fact, a process chamber suitable to practice the processes of the present invention can be any enclosure equipped with one or more gas inlets, at least one gas outlet for evacuating the enclosure, and a source for providing the energy input for driving the chemical reaction in the process, as will be described in more detail below.

The ion-induced, UV-induced, or electron-induced sequential CVD process of the present invention can be used to deposit elemental or compound thin films on the surface of a substrate. Examples of thin films which can be formed using the process of the present invention include dielectric layers, such as silicon dioxide or aluminum oxide layers, and conductive layers, such as titanium or titanium nitride layers. The substrate is typically a semiconductor substrate, such as a silicon wafer, commonly used in the fabrication of integrated circuit devices. Of course, other types of substrates can also be used.

According to the ion-induced, UV-induced, or electron-induced sequential CVD process of the present invention, a substrate is introduced into a CVD reactor. Typically, the reaction chamber of a CVD reactor can hold one or more substrates. However, for simplicity of discussion, it is assumed that only a single substrate is introduced into the CVD reactor. The CVD reactor is evacuated as needed by a suitable pump. In the present embodiment, the CVD reactor is operated at low pressure. In general, the total pressure in the reactor can be maintained at less than about 10 torr. In other embodiments, the CVD reactor can be operated at a pressure ranging from atmospheric pressure to low pressure.

The substrate is heated to a desired temperature such as by placing the substrate on a suitable platform including a heating element. Other methods for heating the substrate can also be used, such as using RF induction heating or using photons. The substrate is typically heated to a temperature of about 50° C. to 400° C., depending on the types of thin films being deposited. The temperature of the substrate is selected to be sufficiently high to prevent condensation of the reaction gases on the surface but allow adsorption, or more particularly chemisorption, to take place for forming a saturated layer of the reactive elements to be introduced.

Next, a flow of a first reactant gas is introduced into the CVD reactor. The reactant gas is introduced in vapor phase as is conventionally done in CVD processes. The first reactant gas is adsorbed on the surface of the substrate and forms a saturated layer of the reactant element. The time required to form a saturated layer of the first reactant is short, typically in the range of 1–30 seconds. Then, the CVD reactor is evacuated of excess reactant.

According to a first embodiment of the present invention where an ion-induced sequential CVD process is used, the substrate surface with the saturated layer of the first reactant element is exposed to a flux of ions. The ions induce a chemical reaction either in the adsorbed saturated layer or between the saturated layer and the substrate surface for forming a thin film of approximately one saturated layer. The reaction time depends on the reactive species. The CVD reactor can then be evacuated of excess gases and reaction by-products. The process sequence can be repeated by introducing a flow of the first reactant gas again. The process is repeated until a thin film of the desired thickness is deposited.

When only one reactant gas is used in the ion-induced sequential CVD process of the present invention, an elemental thin film is formed on the surface of the substrate. For example, in a process to deposit a titanium thin film on a substrate, titanium tetrachloride ($TiCl_4$) is used as the reactant gas and is introduced into a CVD reactor where the $TiCl_4$ molecules are adsorbed on the substrate surface forming a saturated layer. Then, the reaction chamber is evacuated and a flux of ions is introduced into the CVD reactor. The ion flux induces a chemical reaction in the $TiCl_4$ saturated layer such that chlorine atoms are dislodged from the $TiCl_4$ molecules and a saturated layer of titanium is formed.

The ion-induced sequential CVD process of the present invention can also be used to form compound thin films. To form a compound thin film, a second reactant gas containing the necessary reactive species is used. In another embodiment of the ion-induced sequential CVD process of the present invention, a flow of the second reactant gas is introduced into the CVD reactor after the first reactant gas forms a saturated layer and the reactor is evacuated. The second reactant gas does not necessarily form a saturated layer on the surface but instead is available to react with the saturated layer of the first reactant. While the flow of the second reactant gas is being introduced into the CVD reactor, the substrate is exposed to a flux of ions which induces a chemical reaction between the first reactant in the saturated layer and the second reactant gas for forming a compound thin film. The CVD reactor is evacuated of excess gases and reaction byproducts after the chemical reaction is completed and a film of approximately one saturated layer is thus formed. The process sequence can be repeated by introducing the first reactant gas into the CVD reactor again to form a saturated layer. The process sequence can be repeated multiple times to form a thin film of desired thickness. In other embodiments, the flow of the second reactant gas can be introduced and evacuated before the substrate is exposed to a flux of ions.

In another embodiment of the ion-induced sequential CVD process, the second reactant gas is introduced after the saturated layer of the first reactant gas has been exposed to a flux of ions. In this embodiment, after the first reactant forms a saturated layer and the chamber is evacuated, the saturated layer is then exposed to a flux of ions which induces a chemical reaction in the saturated layer as described above for forming a thin film of approximately one monolayer thick. Subsequently, the chamber is evacuated again and a flow of the second reactant gas is introduced into the reactor. During, or after, the second reactant gas is introduced into the reactor, the CVD reactor is again subjected to a flux of ions which induces a chemical reaction between the thin film on the substrate surface and the second reactant gas. Consequently, a compound thin film is formed containing elements of the first reactant gas and the second reactant gas. After the reaction is completed, the CVD reactor is evacuated of excess gases and other volatile reaction byproducts generated during the chemical reaction. The process sequence can be repeated by introducing the first reactant gas into the reactor again for forming a saturated layer. The process sequence can be repeated to form a compound thin film of the desired thickness.

The ion flux used to induce the chemical reaction in the sequential CVD process of the present invention can be inert gas ions, such as argon, or reactive gas ions, such as nitrogen, oxygen, or hydrogen. Typically, inert gas ions or hydrogen ions are used when forming elemental thin films. For instance, argon ions can be used to induce a chemical reaction of an adsorbed saturated layer of TiCl4 molecules to form an elemental titanium thin film. On the other hand, reactive gas ions can be used instead to provide the necessary reactive species. The reactive gas ions can be multi-atomic ions containing the necessary reactive species. For example, when titanium nitride thin film is to be formed, a first reactant gas of titanium tetrachloride can be used to form a saturated layer of titanium tetrachloride. Then the saturated layer can be exposed to a flux of reactive nitrogen ions from an $N_2$ or an $NH_3$ gas. The reactive nitrogen ions induce a chemical reaction in which chlorine atoms are separated from the titanium tetrachloride molecules and nitrogen atoms are bound to the titanium, forming a titanium nitride layer. The process is repeated to form a titanium nitride film of the desired thickness.

The ion flux used in the sequential CVD process of the present invention can be generated in a number of ways. As is well known in the art, one method for generating ions is impact ionization where a gas source is ionized by electrons. The electrons can be generated by a hot filament or other means known in the art. Other methods for generating ions include discharge processes such as a DC plasma discharge or a RF plasma discharge.

When a plasma discharge process is used as an ion source, a gas source is introduced into the CVD reactor and plasma energy is supplied to the reactor either through DC or RF coupling. The plasma energy ionizes the introduced gas and generates the necessary ions for the sequential CVD process. The ion source can be physically separated from the main CVD reactor chamber or the ion source can be a part of the reactor chamber. If the ion source is not in close proximity to the reaction chamber, a series of electrostatic or magnetic elements will be required to direct the ions to the substrate. If the ion source is close to the reaction chamber, a simple drift tube will suffice to direct the ions to the substrate. Also, the ion source can be spaced apart from the substrate surface or it can be in close proximity to the substrate surface. As is well known in the art, the ion energy of the ions can be controlled either by controlling the energy of the ions itself or by biasing the substrate accordingly.

According to another embodiment of the present invention, in an UV-induced sequential CVD process, a flux of ultraviolet (UV) light provides the energy input for driving the chemical reaction in the process, instead of the flux of ions in the ion-induced process. Thus, according to the present embodiment, a substrate is introduced into a CVD reactor. In the present embodiment, the CVD reactor is operated at low pressure. The CVD reactor is evacuated to remove excess gases. A flow of a first reactant gas is introduced into the reactor and forms a saturated layer on the surface of the substrate by adsorption. Then the reactor is evacuated of excess gases. The substrate can then be exposed to a flux of UV light to induce a chemical reaction in the saturated layer to form a thin film. The reactor is then evacuated of excess gases and reaction byproduct.

As in the case of the ion-induced sequential CVD process, the UV-induced sequential CVD process can be used to form compound thin films. Thus, in another embodiment, after the saturated layer of the first reactant is exposed to UV light and the reaction chamber is evacuated, a flow of a second reactant gas is introduced into the reactor. During, or after, the second reactant gas is being introduced, the substrate is exposed to a flux of UV light to induce a chemical reaction between the first reactant in the saturated layer and the second reactant. Alternatively, before exposing the saturated layer of the first reactant to the UV light, a flow of a second reactant gas is introduced into the CVD reactor and the UV light induces a chemical reaction between the saturated layer of the first reactant and the second reactant. After forming a thin film of approximately one saturated layer, the CVD reactor is evacuated of excess gas and reaction byproducts. Of course, the process can be repeated to form a compound thin film of the desired thickness.

In the UV-induced sequential CVD process of the present invention, the UV radiation must be of a high enough energy to induce the chemical reaction of the reactive species of interest. The UV light can be generated from a broad band source such as a black body source. When black body radiation is used to generate the UV light, the source is run at a sufficiently high temperature to generate a high enough flux of UV radiation at a wavelength short enough to induce the chemical reaction. The UV light can also be generated from a variety of plasma discharges. For example, a mercury discharge lamp generates a large amount of UV radiation. A DC or RF plasma discharge can also be used. When RF discharge is used, the electrodes can either be located inside the discharge region or they can be located external to the discharge region. The RF energy can be capacitively or inductively coupled or both. A variety of lasers can also be used to supply the required flux of UV radiation. The UV source can be separate from the CVD reactor or be a part of the reactor. The UV source can be spaced apart from the substrate or it can be in close proximity to the substrate.

According to another embodiment of the present invention where an electron-induced sequential CVD process is used, a flux of electrons is used as the means for inducing the chemical reactions in the CVD process, as opposed to a flux of ions or a flux of UV light, as described above. Thus, according to the present embodiment, a substrate is introduced into a CVD reactor. In the present embodiment, the CVD reactor is operated at low pressure. The CVD reactor is evacuated to remove excess gases. A flow of a first reactant gas is introduced into the reactor and forms a saturated layer on the surface of the substrate by adsorption. Then the reactor is evacuated of excess gases. The substrate can then be exposed to a flux of electrons to induce a chemical reaction in the saturated layer. The reactor is then evacuated of excess gases and reaction byproduct.

The electron-induced sequential CVD process can also be used to form compound thin films as in the case of the ion-induced and UV-induced sequential CVD processes. Thus, in another embodiment, after the saturated layer of the first reactant is exposed to an electron flux and the reaction chamber is evacuated, a flow of a second reactant gas is introduced into the reactor. During, or after, the second reactant gas is being introduced, the substrate is exposed to a flux of electrons to induce a chemical reaction between the first reactant and the second reactant. Alternatively, before exposing the saturated layer of the first reactant to the electron flux, a flow of a second reactant gas is introduced into the CVD reactor and then the substrate is exposed to the flux of electrons which induces a chemical reaction between the saturated layer of the first reactant and the second reactant. After forming a thin film of approximately one saturated layer, the CVD reactor is evacuated of excess gas and reaction byproduct. Of course, the process can be repeated to form a compound thin film of the desired thickness.

In the electron-induced sequential CVD process, the electron flux can be generated from a hot filament as is conventionally done. The electrons can also be generated photoelectrically, such as by exposing an emitting surface to light of sufficient energy to induce the photoelectric effect. The electrons can also be generated from a variety of discharges, such as a DC plasma discharge or a RF discharge. The electron source can be separate from the CVD reactor or be a part of the reactor. The electron source can be spaced apart from the substrate or it can be in close proximity to the substrate.

The ion-induced, UV-induced and electron-induced sequential CVD process of the present invention is capable of depositing thin films with improved film properties. Because the thin film is deposited as one saturated layer at a time, excellent uniformity and conformal step coverage can be achieved. Furthermore, the uniformity of the film can be tailored since the film is deposited as one saturated layer at a time. Thus, the concentration of one element of a film can be gradually or abruptly altered throughout the thickness of the thin film as desired. For example, a titanium-titanium nitride thin film can be deposited where the bulk of the film is elemental titanium and the near-surface layers of the film are titanium nitride.

By using an ion flux, an UV flux, or an electron flux to drive the reaction, the ion-induced, UV-induced and electron-induced sequential CVD process of the present invention can be operated at a lower temperature range than the prior art processes. Furthermore, because only one saturated layer is needed to form the thin film, the process can be used to form compounds of a variety of materials. Moreover, the adsorption process to form a saturated layer is relatively independent of gas flow rate, rendering the process more tolerant of manufacturing conditions. Because the thin film of the present process is formed from a saturated layer, the spatial uniformity of the ion, UV or electron flux impinging on the surface is not critical to the process. The sequential CVD process can be carried out as long as a sufficient quantity of ions, UV photons or electrons are provided to the substrate to complete the reaction. Thus, the ion-induced, UV-induced and electron-induced sequential CVD process of the present invention has a wide process tolerance and improved manufacturability. Other advantages of using ions, electrons and UV photons/radiation include the ability to adjust various process parameters in the sequential CVD process so as to produce the desired thin film. For instance, adjusting the flux and the incident energy of the ions, electrons or UV photons may be useful in selecting the desired chemical reaction in the CVD process for forming a specific film of interest. In the ion-induced and electron-induced sequential CVD processes, the voltage of the ions and electrons can be adjusted electrostatically. On the other hand, in the UV-induced sequential CVD process, the wavelength of the UV photons can be adjusted. For example, the wavelength of a laser can be varied and the wavelength of a continuous source can be filtered to give the desired wavelength. Furthermore, a variety of lamp sources that emit different wavelengths can also be used.

The following examples are provided to illustrate the application of the ion-induced, UV-induced, or electron-induced sequential CVD process of the present invention in the formation of a titanium film and a titanium nitride film. The process conditions are illustrative only and a person of ordinary skill in the art would know how to modify the process conditions to obtain the desired process characteristics and film properties.

To form a layer of titanium on a silicon substrate, a first reactant gas of titanium tetrachloride ($TiCl_4$) is used. When the substrate is exposed to the $TiCl_4$ gas, the $TiCl_4$ gas molecules are adsorbed onto the surface of the substrate and a saturated layer of $TiCl_4$ is formed. Then the substrate is exposed to a flux of hydrogen ions ($H^+$) which reacts with the chlorine atoms in the saturated layer, forming hydrogen chloride. Hydrogen chloride is a volatile reaction byproduct and is exhausted out of the CVD reactor. When the reaction is complete, a saturated layer of titanium atoms is left on the silicon substrate. Alternatively, instead of hydrogen ions, a flow of hydrogen ($H_2$) gas can be used in the presence of a UV light source. The UV light functions to break the bonds of the $H_2$ molecules, making the hydrogen atoms available to react with the chlorine atoms in the saturated layer. The UV light also functions to break the bonds between the chlorine atoms and the titanium atoms, allowing the chlorine to react freely with the hydrogen. In yet another embodiment, instead of hydrogen ions, a flow of hydrogen ($H_2$) gas can be used in the presence of a flux of electrons. The electrons function to dissociate the bonds between the $H_2$ molecules and between the chlorine and titanium molecules. Hydrogen and chlorine react, forming a volatile reaction byproduct. A titanium saturated layer results.

To form a layer of titanium nitride, titanium tetrachloride ($TiCl_4$) and ammonia ($NH_3$) are used. When the ion-induced sequential CVD process is used, a substrate with a saturated layer of $TiCl_4$ is exposed to a flow of $NH_3$ gas. While the flow of $NH_3$ gas is being introduced, the substrate is subjected to a flux of ions which dissociates the bonds between the nitrogen and hydrogen atoms of the $NH_3$ gas and the chlorine and titanium atoms of the $TiCl_4$ gas. The nitrogen atoms react with the titanium atoms, forming a saturated layer of titanium nitride. Alternatively, when the UV-induced sequential CVD process is used, the substrate with a saturated layer of $TiCl_4$ can be first subjected to a flux of UV light which functions to dissociate the chlorine atoms from the titanium atoms. Then, a flow of NH$_3$ gas is introduced which reacts with the titanium to form titanium nitride. By using this process sequence, it is possible to avoid exposing the second reactant gas to UV light which may be desirable in some situations.

The above detailed descriptions are provided to illustrate specific embodiments of the present invention and are not intended to be limiting. Numerous modifications and variations within the scope of the present invention are possible. For example, in the above embodiments, the process chamber is described as being operated at low pressure (such as less than about 10 torr). However, this is illustrative only and in other embodiments, the ion-induced, UV-induced, or electron-induced sequential CVD process of the present invention can be practiced in a process chamber operated at a pressure ranging from atmospheric pressure to low pressure. The present invention is defined by the appended claims.

We claim:

1. A process for depositing a thin film on a substrate, comprising:

(a) placing said substrate in a process chamber;

(b) evacuating said process chamber;

(c) introducing a flow of a first reactant gas in vapor phase into said process chamber, said first reactant gas forming an adsorbed saturated layer of said first reactant gas on said substrate;

(d) evacuating said process chamber;

(e) exposing said substrate to a flux of electrons for inducing a chemical reaction of said adsorbed saturated layer of said first reactant gas to form said thin film; and (f) evacuating said process chamber.

2. The process of claim 1, further comprising repeating said acts (c) through (f) to form multiple layers of said thin film.

3. The process of claim 1, further comprising:

(g) introducing a flow of a second reactant gas in vapor phase into said process chamber before said act (e).

4. The process of claim 3, wherein said exposing said substrate to said flux of electrons induces a chemical reaction of said adsorbed saturated layer of said first reactant gas and said second reactant gas for forming a compound thin film.

5. The process of claim 3, further comprising repeating said acts (c) through (f) to form multiple layers of said thin film.

6. The process of claim 3, further comprising:

evacuating said process chamber between said acts (g) and (e).

7. The process of claim 1, further comprising after said act (f):

(g) introducing a flow of a second reactant gas in vapor phase into said process chamber;

(h) exposing said substrate to a flux of electrons for inducing a chemical reaction of said adsorbed saturated layer of said first reactant gas and said second reactant gas to form a compound thin film; and (i) evacuating said process chamber.

8. The process of claim 7, further comprising repeating said acts from (c) through (i) to form multiple layers of said thin film.

9. The process of claim 7, further comprising:

evacuating said process chamber between said (g) and (h).

10. The process of claim 1, wherein said flux of electrons is generated by a hot filament.

11. The process of claim 1, wherein said flux of electrons is generated using photoelectric effect.

12. The process of claim 1, wherein said flux of electrons is generated using plasma discharge.

13. The process of claim 1, further comprising:

heating said substrate to an elevated temperature after said act (a).

14. The process of claim 13, wherein said elevated temperature is between 50° C. to 400° C.

15. The process of claim 1, wherein said process chamber is a chemical vapor deposition reactor.

16. The process of claim 1, wherein said process chamber is operated at a pressure lower than about 10 torr.

* * * * *